United States Patent
Roy et al.

(10) Patent No.: US 9,064,911 B2
(45) Date of Patent: Jun. 23, 2015

(54) HEATED COOLING PLATE FOR E-CHUCKS AND PEDESTALS

(75) Inventors: Shambhu N. Roy, San Jose, CA (US); Matt Cheng-hsiung Tsai, Cupertino, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 1218 days.

(21) Appl. No.: 12/603,149

(22) Filed: Oct. 21, 2009

(65) Prior Publication Data

US 2010/0101771 A1    Apr. 29, 2010

Related U.S. Application Data

(60) Provisional application No. 61/108,480, filed on Oct. 24, 2008.

(51) Int. Cl.
*H01L 21/67* (2006.01)

(52) U.S. Cl.
CPC ................ *H01L 21/67109* (2013.01)

(58) Field of Classification Search
USPC ............... 156/345.51–345.53; 118/724, 725; 204/298.09, 298.15
See application file for complete search history.

(56) References Cited

U.S. PATENT DOCUMENTS

| | | | |
|---|---|---|---|
| 5,886,866 A | 3/1999 | Hausmann | |
| 5,981,913 A * | 11/1999 | Kadomura et al. | ........ 219/444.1 |
| 6,067,222 A | 5/2000 | Hausmann | |
| 6,104,596 A | 8/2000 | Hausmann | |
| 6,506,291 B2 * | 1/2003 | Tsai et al. | |
| 6,529,686 B2 * | 3/2003 | Ramanan et al. | ............. 392/418 |
| 6,563,686 B2 * | 5/2003 | Tsai et al. | ..................... 361/234 |
| 6,705,394 B1 * | 3/2004 | Moslehi et al. | ................ 165/206 |
| 6,853,533 B2 | 2/2005 | Parkhe | |
| 7,311,779 B2 | 12/2007 | Nguyen et al. | |
| 7,429,718 B2 | 9/2008 | Inagawa et al. | |
| 7,436,645 B2 | 10/2008 | Holland et al. | |
| 2002/0036881 A1 | 3/2002 | Shamouilian et al. | |
| 2004/0131858 A1 * | 7/2004 | Burden et al. | ................. 428/408 |
| 2004/0226515 A1 * | 11/2004 | Yendler et al. | ................ 118/728 |
| 2006/0002053 A1 | 1/2006 | Brown et al. | |
| 2006/0051966 A1 | 3/2006 | Or et al. | |
| 2007/0079761 A1 | 4/2007 | Yendler et al. | |

OTHER PUBLICATIONS

"Graphite." Obtained from http://en.wikipedia.org/wiki/Graphite on May 16, 2014.*

* cited by examiner

*Primary Examiner* — Maureen Gramaglia
(74) *Attorney, Agent, or Firm* — Patterson & Sheridan, LLP

(57) ABSTRACT

A method and apparatus for controlling the temperature of a substrate support assembly includes a pedestal, a chuck connected to the pedestal, a cooling plate structure thermally coupled with the chuck, a heater thermally coupled with the cooling plate structure, and a controller configured to control the cooling plate structure while controlling the heater during processing of a substrate on the chuck. The method includes cooling a substrate support with a cooling plate structure while heating the cooling plate structure with a heater thermally coupled with the cooling plate structure, monitoring the performance of the cooling plate structure and the heater, and regulating the performance of the cooling plate structure and the heater to maintain the substrate support at a desired temperature.

17 Claims, 4 Drawing Sheets

HEATED COOLING PLATE FOR E-CHUCKS AND PEDESTALS

CROSS-REFERENCE TO RELATED APPLICATIONS

This application claims benefit of U.S. provisional patent application Ser. No. 61/108,480, filed Oct. 24, 2008, which is herein incorporated by reference.

BACKGROUND OF THE INVENTION

1. Field of the Invention

Embodiments of the present invention generally relate to semiconductor substrate processing systems and more particularly to a substrate support apparatus for retaining a substrate in a processing chamber.

2. Description of the Related Art

In the processing of substrates, such as semiconductor wafers and displays, a substrate support is used to retain a substrate during a particular manufacturing process. The substrate support apparatus may include an electrostatic chuck for attracting and retaining a substrate, such as a semiconductor wafer, during a manufacturing process such as in a physical vapor deposition (PVD) processing system, chemical vapor deposition (CVD) processing system, etching system, and chemical mechanical polishing (CMP) system. In substrate processing equipment, the electrostatic chuck may be detachably secured to a pedestal within the process chamber that is capable of raising and lowering the height of the chuck and substrate.

In a typical chamber process, energized process gas is used to process a substrate for depositing or removing material. During processing, the desired temperature of the substrate for a given process may vary greatly. For example, low processing temperatures such as around −60° C. or higher processing temperatures of around 350° C. may be necessary for various manufacturing steps. Methods for fine tuning the temperature of the electrostatic chuck help achieve desired temperatures over such large processing temperature ranges.

SUMMARY OF THE INVENTION

In one embodiment, a system for controlling the temperature of a substrate support assembly in a processing chamber includes a pedestal, a chuck connected to the pedestal, a cooling plate structure thermally coupled with the chuck, a heater thermally coupled with the cooling plate structure, and a controller configured to control the cooling plate structure while controlling the heater during processing of a substrate on the chuck.

In one embodiment, the cooling plate structure in the system has conduits for cooling fluid flow. In another embodiment, the heater is disposed above the cooling plate structure. A thermal interface material may be disposed between the heater and the cooling plate structure and between the heater and the chuck. The thermal interface material may comprise graphite, and may have holes formed through it to control the transfer of heat through the thermal interface material.

In another embodiment, the heater in the system is disposed below the cooling plate structure. A thermal interface material may be disposed between the heater and the cooling plate structure and between the cooling plate structure and the chuck. The thermal interface material may comprise graphite, and may have holes formed there through to control the transfer of heat through the thermal interface material.

In another embodiment, the controller may be configured to control the cooling plate structure while controlling the heater by adjusting the flow of cooling liquid to the cooling plate structure while adjusting the power supplied to the heater. The system may also comprise at least one valve for adjusting the flow of the cooling liquid to the cooling plate structure.

In another embodiment, a substrate support assembly includes a pedestal, a chuck connected to the pedestal, a cooling plate structure thermally coupled with the chuck, a heater thermally coupled with the cooling plate structure, and a controller configured to control the cooling plate structure while controlling the heater using a proportional-integral-derivative (PID) subcontroller thermally coupled to the heater. The cooling plate structure may have conduits for cooling fluid flow. In another embodiment, the controller may be configured to control the cooling plate structure by adjusting the flow of cooling liquid to the cooling plate structure while controlling the heater using a PID subcontroller to control the power supplied to the heater.

In one embodiment, the heater may be disposed above the cooling plate structure. A thermal interface material may be disposed between the heater and the cooling plate structure and between the heater and the chuck.

In another embodiment, the heater may be disposed below the cooling plate structure. A thermal interface material may be disposed between the heater and the cooling plate structure and between the cooling plate structure and the chuck.

In yet another embodiment, a method of controlling the temperature of a substrate support in a processing chamber includes cooling a substrate support with a cooling plate structure while heating the cooling plate structure with a heater thermally coupled with the cooling plate structure, monitoring the performance of the cooling plate structure and the heater, and regulating the performance of the cooling plate structure and the heater to maintain the substrate support at a desired temperature. In one embodiment, the monitoring and regulating of the performance of the heater is done using a proportional-integral-derivative (PID) controller.

In another embodiment, the method may further include controlling a flow of cooling liquid to the cooling plate structure while heating the cooling plate structure to maintain the temperature of the substrate support substantially constant. In yet another embodiment, the method may further include opening a valve 100 percent to allow a flow of cooling liquid to the cooling plate structure when the temperature of the substrate support increases above a first set temperature, and completely closing the valve when the temperature of the substrate support decreases below a second set temperature. In another embodiment, the method may further include partially opening a valve to allow a reduced flow rate of cooling liquid of less than 100 percent to the cooling plate structure when the temperature of the substrate support increases above a first set temperature, and completely closing the valve when the temperature of the substrate support decreases below a second set temperature. The reduced flow rate of cooling liquid may be related to a deviation of the temperature of the substrate support from the first set temperature.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only

DETAILED DESCRIPTION

Figure 1A:
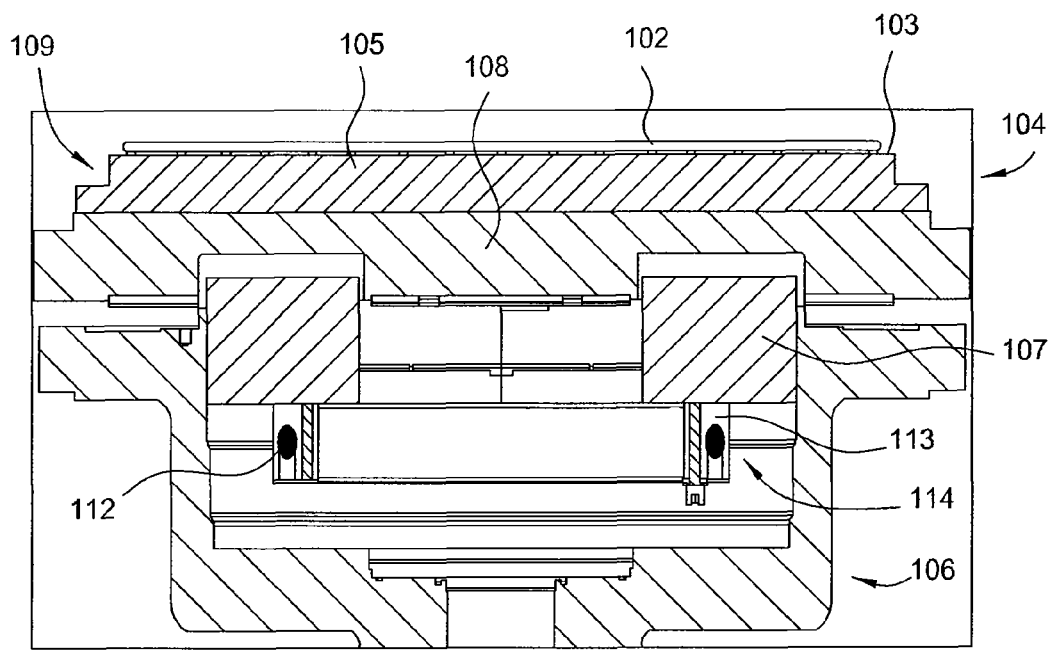
FIG. 1A is a partial cross-sectional view of a substrate support of one embodiment of the invention.

FIG. 1A depicts one embodiment of the present invention. A substrate support assembly 104, such as a detachable electrostatic chuck assembly, retains a substrate 102 on the support surface 103 of the chuck 109. The chuck 109 may include a puck 105 and a base support 108. In one embodiment the puck 105 may comprise a ceramic material such as aluminum nitride and the base support 108 may comprise a composite of ceramic and metal for better strength and durability and also has good heat transfer properties. For example, the base support 108 may comprise aluminum with silicon carbide. The chuck 109 may also include a pair of embedded electrodes (not shown) for electrostatically holding the substrate 102 on the support surface 103. For example, the electrodes may be connected to a power supply that delivers a DC chucking voltage.

A pedestal 106 is connected to the chuck 109 for raising and lowering the chuck 109 during processing. A cooling plate structure 107 is thermally coupled with the chuck 109. The cooling plate structure 107 may be used to cool the chuck 109 during processing of the substrate 102. A heater 112 is thermally coupled with the cooling plate structure 107. In one embodiment, the heater 112 is embedded in a metal body 113, such as stainless steel, thereby forming a heating assembly 114, which is connected to the cooling plate structure 107. As shown in FIG. 1A, the heating assembly 114 may be a ring heater with a metal body 113 made of stainless steel and a tubular heater 112. The metal body 113 may be positioned below the cooling plate structure 107. Thus, the heater 112 is thermally coupled to the underside of the cooling plate structure 107.

Figure 1B:
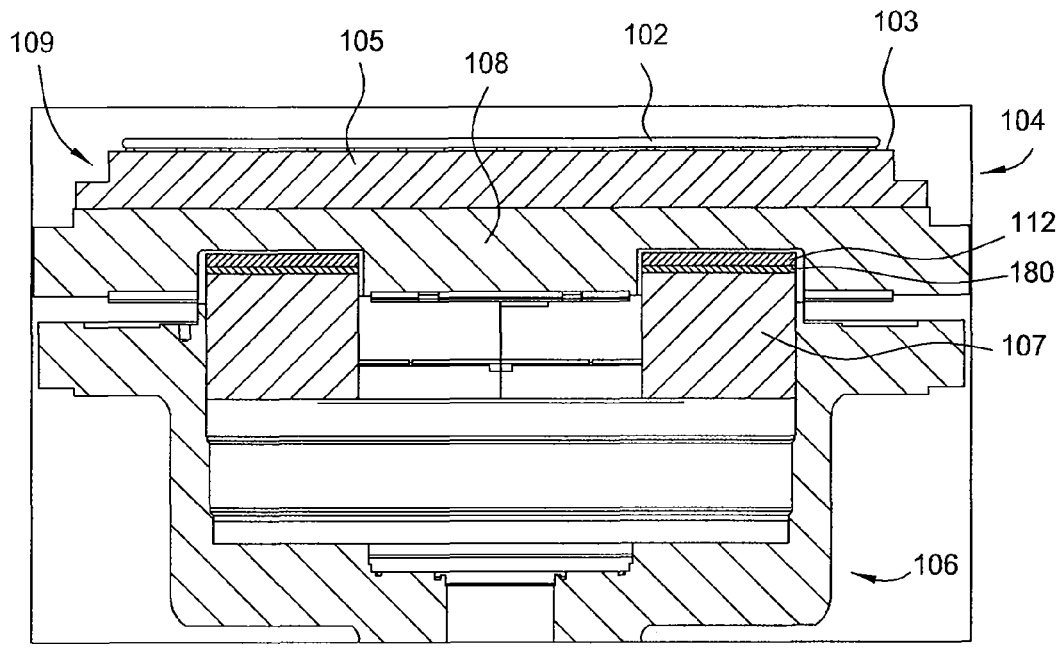
FIG. 1B is a partial cross-sectional view of a substrate support of one embodiment of the invention.

FIG. 1B depicts another embodiment of the substrate support assembly 104, wherein the heating assembly 114 is thermally coupled to the top side of the cooling plate structure 107, and is positioned between the cooling plate structure 107 and the chuck 109. This configuration may allow for faster heating of the chuck 109 by preventing the cooling effect of the cooling plate structure 107 on the chuck 109 from overpowering the heating effect of the heating assembly 114. In this embodiment, only part of the cooling plate may be directly exposed to the chuck 109 through thermal interface material and a part of it is hidden under the heater assembly 114. In another embodiment, the cooling plate structure 107 and the heating assembly 114, including the heater 112, may form a concentric annular structure, where the heating assembly 114 is located and connected to the cooling plate structure 107 along an inside diameter of the cooling plate structure 107.

In embodiments where the chuck 109 is made of a ceramic material, the heater 112 may be placed outside of the chuck 109 instead of within the ceramic chuck. For example, the heater 112 may be bolted below the cooling plate (see FIG. 3). This configuration is less expensive than having the heater 112 embedded in the chuck 109 with a support plate. This configuration also avoids issues with cracking of the chuck 109 due to different thermal expansion coefficients between the ceramic material and the material of the support plate, and avoids issues with the heater current being too close to the wafer being processed.

In any of the embodiments, a thermal interface material 180 (see FIG. 1B) may be disposed between the cooling plate structure 107, the heating assembly 114, and the chuck 109 for improved heat transfer between the substrate support assembly components. For example, thermal interface material 180 may comprise thermally conductive sheets placed between one or more surfaces of the components comprising the substrate support assembly 104. In one embodiment, such as the configuration at FIG. 1A, thermal interface material 180 may be placed between the bottom surface of the base support 108 and the top surface of the cooling plate structure 107. Additionally, thermal interface material 180 may be disposed between the bottom surface of the cooling plate structure 107 and the heater assembly 114. In another embodiment, such as the configuration at FIG. 1B, thermal interface material 180 may also be disposed between the bottom surface of the heater assembly 114 and the top surface of cooling plate structure 107, as shown at FIG. 1B. Furthermore, thermal interface material 180 may be placed between the bottom surface of the base support 108 and the top surface of the heater assembly 114.

Regardless of geometric configuration between the chuck 109, the heating assembly 114, and the cooling plate structure 107, any of the thermally coupled surfaces between these components may have thermal interface material 180 between them to improve heat transfer characteristics of the substrate support assembly 104. A thermal interface material 180 with a large resistance may prevent direct loss of heating power to cooling plate structure 107. The thermal interface material 180 may include thermally conductive sheets which may comprise graphite foil such as GRAFOIL® flexible graphite commercially available from UCAR International, Inc., Nashville, Tenn., aluminum, and the like. The thickness of the thermal interface material may be within a range of about 1-5 micrometers.

Moreover, thermal interface material 180 may be tuned to allow for optimum cooling at a desired temperature. For example, the area of the thermal interface material 180 may be controlled by patterning or punching holes in the thermal interface material 180 to affect the contact area.

Figure 2:
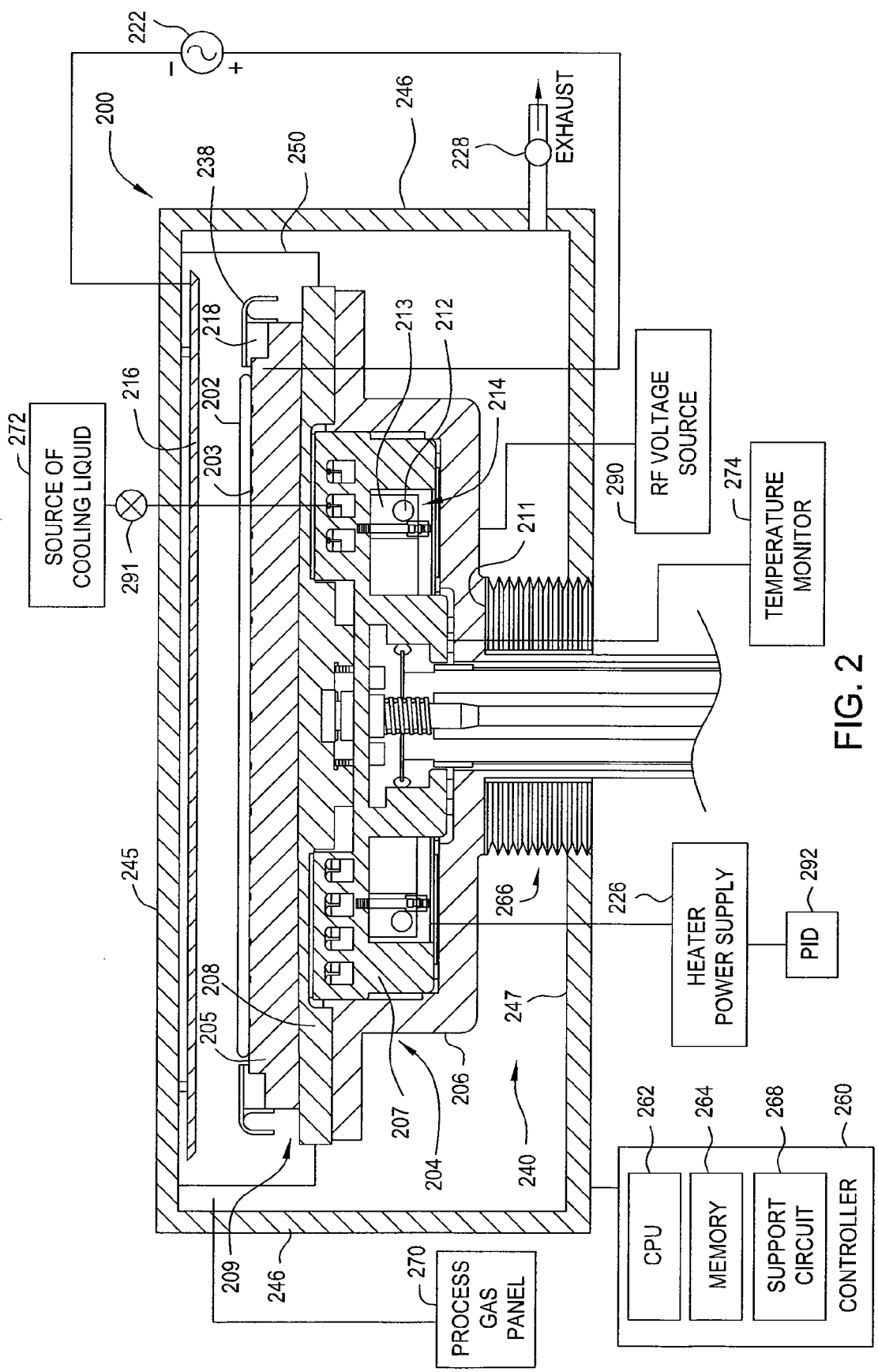
FIG. 2 is a partial cross-sectional view of a processing chamber housing of an embodiment of the invention.

FIG. 2 depicts a schematic diagram of an exemplary processing chamber 200 having one embodiment of a substrate support assembly 204 that may illustratively be used to practice the invention. The particular embodiment of the processing chamber 200 shown herein is provided for illustrative purposes and should not be used to limit the scope of the invention.

FIG. 2 depicts a partial cross-sectional view of a processing chamber 200 containing the present invention. The processing chamber 200 comprises a bottom 247, a plurality of walls 246, and a lid 245 to form a vacuum chamber. The processing chamber 200 is illustratively a physical vapor deposition (PVD) processing chamber 200 for processing a substrate, e.g., a semiconductor wafer 202 therein. One skilled in the art will recognize that the processing chamber may be any type of chamber for processing a substrate, such as a chemical vapor deposition (CVD) chamber, etch chamber, and the like. For example, embodiments of the invention may be used in a physical vapor deposition chamber manufactured by Applied Materials, Inc. of Santa Clara, Calif.

A controller 260 includes a central processing unit (CPU) 262, a memory 264, and support circuits 268. The controller 260 is coupled to and controls components of the process chamber 200, processes performed in the chamber 200, and it may also facilitate an optional data exchange with databases of an integrated circuit fab. The controller 260 may control, among other things, the process gasses introduced into the chamber 200 and the power supplied to the substrate support assembly 204. The controller 260 may also control process variables using subcontrollers.

The wafer 202 is disposed on a substrate support assembly 204 for retaining a wafer (e.g., a 200 or 300 mm wafer) against an electrostatic chuck assembly 209, providing RF biasing to the wafer in a well-defined and insulated path that is internal to the substrate support assembly 204, and operating in a temperature range of approximately −60° C. to 350° C. Specifically, the wafer 202 rests on a support surface 203 of a substrate support assembly 204. The substrate support assembly 204 comprises an electrostatic chuck assembly 209 disposed on a pedestal 206. The electrostatic chuck assembly 209 further comprises a puck 205 and a base support 208.

In one embodiment, the electrostatic chuck assembly 209 is disposed on the cooling plate structure 207 and the heater assembly 214 to provide temperature regulation of the electrostatic chuck assembly 209. The pedestal 206 is disposed beneath the cooling plate structure 207 and the heater assembly 214 to support the cooling plate structure 207, the heater assembly 214, and the electrostatic chuck assembly 209. In one embodiment, the heater assembly 214 includes a heater 212 embedded in a stainless steel body 213. The electrostatic chuck assembly 209, heater assembly 214, cooling plate structure 207, and pedestal 206 together form the substrate support assembly 204. A shaft 266 supports the substrate support assembly 204 at a lower portion 211 of the pedestal 206 from the bottom 247 of the chamber 200. The pedestal 206 and shaft 266 are electrically connected to ground.

The shaft 266 houses the necessary electrical wiring and plumbing to transfer power (e.g., RF and DC) and heat transfer fluids respectively from various remote sources to the substrate support assembly 204. For example, a source of cooling liquid 272 is fluidly coupled to the cooling plate structure 207. The source of cooling liquid 272 may provide cooling liquid at various flow rates and input temperatures which may be monitored and regulated by the controller 260 to achieve a desired temperature of the puck 205. Moreover, temperature of the puck 205 may be monitored using a plurality of sensors (not shown), such as, thermocouples and the like, that are coupled to a temperature monitor 274. The controller 260 may monitor variables such as cooling liquid flow rate, cooling liquid input temperature, temperature of the heater 212, and temperature of the puck 205. Based on the values of these monitored variables, the controller 260 may regulate the power supplied to the heater 212 using, for example, a subcontroller 292. The subcontroller 292 may be a PID controller. The controller 260 may also regulate the flow of cooling liquid into the cooling plate structure 207 by, for example, adjusting a valve 291 downstream of the source of cooling liquid 272. By monitoring and regulating these variables, the desired temperature of the substrate support assembly may be achieved, even during high power and heating fluctuation that may occur during plasma processing.

A method of controlling the temperature of the substrate support assembly 204 in the processing chamber 200 is hereby achieved. The method may include cooling a substrate support assembly 204 with a cooling plate structure 207 while heating the cooling plate structure with a heater 212 that is thermally coupled with the cooling plate structure 207. The controller 260 monitors and regulates the performance of the cooling plate structure 207 and the heater 212. As the controller 260 receives data inputs from the temperature monitor 274, it can manipulate the cooling liquid flow rate, input temperature, and heater temperature to control the temperature of the substrate support assembly 204. A valve 291 downstream of the source of cooling liquid may be used to adjust the flow rate of cooling liquid to the cooling plate structure 207.

The substrate support assembly 204 may allow for fast temperature control of the electrostatic chuck assembly 209. In one embodiment, wherein the cooling plate structure 207 has a higher efficiency than the heater 212, the cooling and heating may be initially matched such that the cooling does not overpower the heating. For example, if the cooling plate structure 207 has an efficiency of about 10 kW, and the heater 212 has an efficiency of about 1 kW, then the flow of cooling liquid to the cooling plate structure 207 may be reduced such that the effective cooling efficiency is reduced to about 1 kW, comparable to the efficiency of heater 212. This may be done using a valve. Once the flow rate of the cooling liquid is reduced, the heating and the cooling will essentially cancel each other out, and the temperature of the electrostatic chuck assembly 209 may be held substantially constant. Reducing the flow of the cooling liquid even further such that the effective cooling power is about 500 W will allow the heater to provide heat to the electrostatic chuck assembly 209.

Once the cooling and the heating power are matched as described above, controller 260 may be used to control the temperature of electrostatic chuck assembly 209 by controlling the power supplied to heater 212 through subcontroller 292. Subcontroller 292 may be a PID controller. In one embodiment, the temperature of the electrostatic chuck assembly 209 may be controlled by switching the flow of cooling liquid between "on" and "off" states, wherein the "on" state involves 100% flow rate of cooling liquid and the "off" state involves zero flow of cooling liquid. For example, if the electrostatic chuck assembly 209 overshoots a set temperature, depending on the excess process power, controller 260 may regulate the cooling plate structure 207 by turning the flow of cooling liquid all the way to "on" state, such as by completely opening a valve 291 such that the flow of cooling liquid is at 100% or full capacity. The temperature of the electrostatic chuck assembly 209 may decrease rapidly due to the high flow of cooling liquid. Once the temperature of the electrostatic chuck assembly 209 has been sufficiently reduced, the flow of cooling liquid may be shut off completely to the "off" state, such as by shutting off the valve 291 regulating the flow of cooling liquid. In one example, if the setpoint temperature for the electrostatic chuck assembly 209 is 75° C., and the processing of the substrate heats the electrostatic chuck assembly 209 to a temperature of 78° C., then the cooling liquid flow may be turned on and maintained at a 100% flow rate to rapidly cool the electrostatic chuck assembly 209 to a desired temperature. For example, the cooling liquid flow rate may be maintained at a 100% flow rate of about 2 gallons/minute for about 5 seconds. Maintaining the cooling liquid at full flow may cause the temperature to drop to, e.g., 73° C., at which point the cooling liquid flow may be shut off completely. The flow rate of cooling liquid may then be maintained in the "off" state for about 20 seconds. Controller 260 may then take over the temperature control by controlling the power to heater 212, which may be done using a subcontroller 292, such as a PID controller. If the temperature of the electrostatic chuck assembly 209 increases again, the cooling liquid flow can be switched back to the "on" state, with the valve 291 opened to the 100% flow rate, or "on"

position, until the temperature drops back down. The cooling liquid flow can then be turned off when the electrostatic chuck assembly 209 reaches a desired temperature. This on/off switching of the flow of cooling liquid can be used to control the temperature of the electrostatic chuck assembly 209 over large temperature ranges.

In another embodiment, once the cooling and heating are matched as described above, the controller 260 may control the temperature of the electrostatic chuck assembly 209 by causing the cooling liquid to flow at a reduced rate (i.e. not full capacity) in order to minimize temperature fluctuations, since flowing the cooling liquid at full capacity may cause an excessive, undesired undershoot in temperature. For example, according to the embodiment described above, if the set-point temperature for the electrostatic chuck assembly 209 is 75° C. and the process heats the electrostatic chuck assembly 209 to a temperature of 78° C., then the cooling liquid flow may be opened to full capacity to reduce the temperature of the electrostatic chuck assembly 209. However, the large cooling liquid flow rate may, in some instances, cause the temperature to drastically drop to 60° C. Finer temperature control may be accomplished by only partially opening the cooling liquid valve 291 in order to reduce the temperature of the electrostatic chuck assembly 209, and then shutting the valve 291 once the desired temperature is reached. For example, in order to avoid such a huge undershoot in the temperature of the electrostatic chuck assembly 209, the valve 291 for the cooling liquid may be opened partially, e.g., at 20% capacity, to reduce the flow of cooling liquid and hence the cooling effect. For example, in the "on" position, the cooling liquid valve 291 may be opened only to about 20% capacity, resulting in a flow rate of about 0.4 gallons/minute. In other embodiments, the cooling liquid valve 291 may be opened to about 40% capacity, resulting in a flow rate of about 0.8 gallons/minute. This flow rate may be maintained for about 15 seconds. The extent to which cooling liquid valve 291 is opened in the "on" position may depend on how much the temperature of the substrate support deviates from a set temperature. Once the temperature is reduced, the valve 291 may be closed completely to the "off" position, resulting in zero flow. This "off" state may be maintained for about 30 seconds, during which the temperature of the electrostatic chuck assembly 209 may be controlled by the controller 260 using subcontroller 292, which may be a PID controller, to control the power to the heater 212. This embodiment applies the same type of on/off cooling liquid flow control as the embodiment described above, but at lower flow rates.

In the processing chamber 200, physical vapor deposition (PVD) processing may be used to deposit a thin film of material on the wafer 202. A target 216 comprising a sputtering or deposition material is positioned over the substrate support assembly 204. The target 216 is electrically insulated from the processing chamber 200, and may be fabricated from a material such as aluminum, tantalum, titanium, tungsten, copper, or any other material suitable for being deposited as a thin film of the target. Exhaust vacuum pump 228 creates a vacuum in the chamber during processing of the substrate. The pressure in the processing chamber 200 is reduced to about $10^{-10}$ to $10^{-6}$ Torr, after which a gas (e.g., argon), is introduced into the chamber 200 to produce a partial pressure ranging between 0.1 mTorr to approximately 20 mTorr. Process gasses may be provided to the process volume of the processing chamber 200 from a gas panel 270.

A remote DC power source 222 is electrically connected between the target 216 and substrate support assembly 204 for magnetron sputtering of the target 216. Additionally, a RF (radio frequency) voltage source 290 is coupled to the substrate support assembly 204. In one embodiment, one or more rings such as a waste ring 218 and/or a cover-ring 238, and/or a shield 250 circumscribe the electrostatic chuck assembly 209, which may be an electrostatic chuck assembly. The waste ring 218, cover-ring 238, and shield 250 help to prevent unwanted deposition material from accumulating into a lower chamber region 240, as well as provide uniform wafer processing at the edges of the wafer 202.

The electrostatic chuck assembly 209 is generally formed from ceramic or similar dielectric material and comprises at least one clamping electrode (not shown) controlled using a power source 222. In a further embodiment, the electrostatic chuck assembly 209 may comprise at least one RF electrode (not shown) coupled, through a matching network (not shown), to a power source 222 of substrate bias. The heater 212 is connected to a heater power supply 226.

Figure 3:
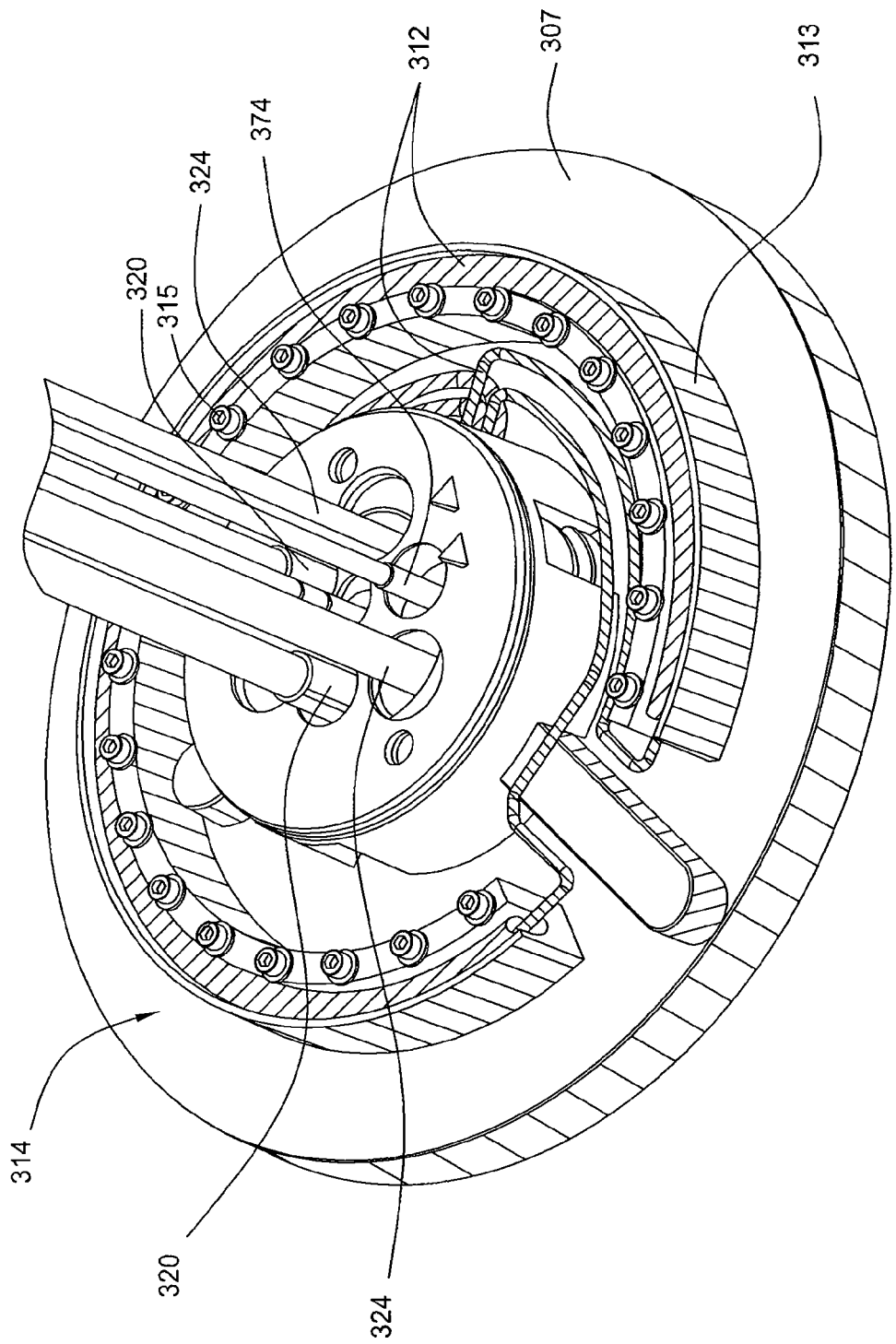
FIG. 3 is an isometric view of one embodiment of the invention.

FIG. 3 depicts an isometric view of one embodiment of the invention. The heater assembly 314 includes a stainless steel body 313 and a heater 312. In this embodiment, the heater assembly is mechanically attached to the underside of the cooling plate structure 307 by screws 315. Other means of attaching the heater assembly to the cooling plate structure 307 may be employed such as bolts, adhesives and the like. Cooling liquid flows through the cooling plate structure 307 to and from a liquid source, such as a chiller, via fluid conduits 320. A thermocouple 374 to monitor temperature passes through the cooling plate structure 307 along with RF power feed conduits 324 to the puck (not shown).

Figure 4:
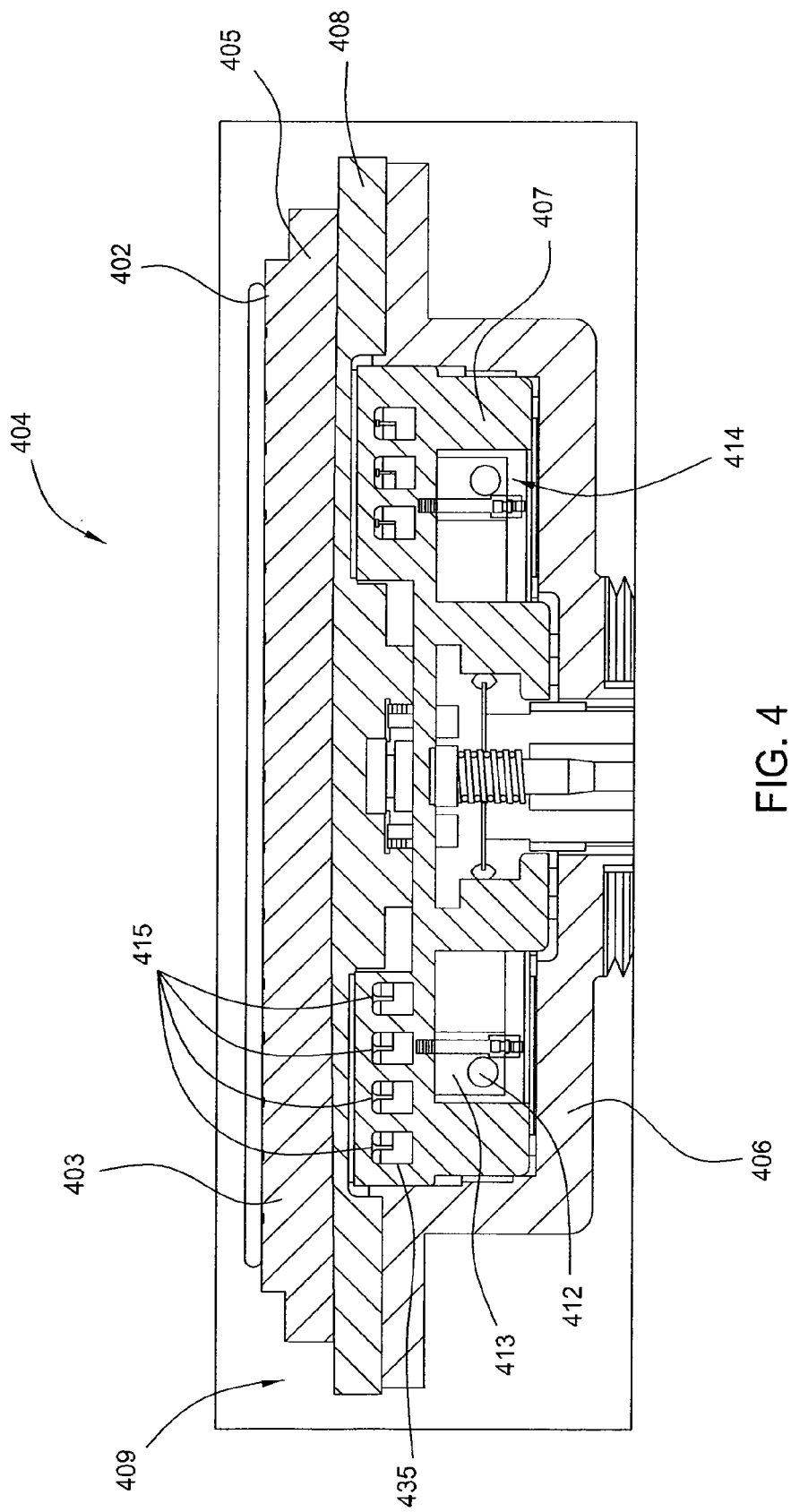
FIG. 4 is a cross-sectional view of an embodiment of the present invention.

FIG. 4 depicts a partial cross-sectional view of a first embodiment of substrate support assembly 404 of FIGS. 2 and 3. Specifically, the substrate support assembly 404 comprises an electrostatic chuck assembly 409 coupled to a pedestal 406. The electrostatic chuck assembly 409 further comprises the puck 405 coupled to a base support 408, and both components are thermally coupled to the cooling plate structure 407. The cooling plate structure 407 is then coupled to an upper surface of the pedestal 406. The puck 405 may be fabricated from a ceramic material such as aluminum nitride, silicon dioxide, silicon nitride, alumina, and the like. Preferably, the puck 405 is fabricated from aluminum nitride and shaped as a thin circular puck.

The puck 405 may also comprise a peripheral flange, which circumscribes a lower edge of the puck 405. The flange is optionally used to support the waste ring 218 and/or cover ring 238 shown in FIG. 2. The waste ring 218, cover ring 238, and peripheral flange together help prevent deposit material from accumulating below the top surface 403 of the puck 405.

The cooling plate structure 407 provides temperature regulation for the substrate support assembly 404 and the puck 405, in particular the area on which the substrate 402 rests. In one embodiment, the cooling plate structure 407 and the top surface 403 of the puck 405 have substantially equal diameters. In one embodiment, the cooling plate structure 407 has a diameter at least equal to the diameter of the supporting top surface 403 of the puck 405. The cooling plate structure 407 thermally coupled to the heating assembly 414 including the heater 412 and the stainless steel body 413, allows for temperature control of the entire top surface 403 and thus the substrate 402. Specifically, since the cooling plate structure 407 is disposed beneath and extends in diameter at least the same diameter as the supporting top surface 403 of the puck 405, temperature regulation is provided over the entire area of the supporting top surface 403.

The cooling plate structure may comprise a cooling channel or channels 415 positioned at the upper surface 435 of the cooling plate structure 407. In one embodiment of the invention, the cooling channels 415 extend radially outward in the cooling plate structure 407 in a coil-like manner. The cooling channels 415 are formed (e.g., machined, etched, or the like) in the upper surface 435 of the cooling plate structure 407. Although this embodiment depicts cooling channels formed within the cooling plate structure as a means for transferring heat from the cooling plate structure, other means may also be employed such as a cooling plate structure that has separate and distinct pipes attached to the cooling plate body.

While the foregoing is directed to embodiments of the present invention, other and further embodiments of the invention may be devised without departing from the basic scope thereof, and the scope thereof is determined by the claims that follow.

The invention claimed is:

1. A system for controlling the temperature of a substrate support assembly in a processing chamber, the system comprising:
    a pedestal;
    a chuck connected to the pedestal;
    a cooling plate structure thermally coupled with the chuck;
    a heater thermally coupled with the cooling plate structure;
    a thermal interface material consisting of a single graphite material forming thermally conductive sheets disposed between the heater and the cooling plate structure, wherein the thermal interface material has a plurality of holes formed therethrough in a pattern that limits loss of heating power to the cooling plate structure; and
    a controller configured to control the cooling plate structure while controlling the heater during processing of a substrate on the chuck.

2. The system of claim 1, wherein the cooling plate structure has conduits for cooling fluid flow.

3. The system of claim 1, wherein the heater is disposed above the cooling plate structure.

4. The system of claim 3, further comprising a graphite thermal interface material disposed between the heater and the chuck.

5. The system of claim 1, wherein the heater is disposed below the cooling plate structure.

6. The system of claim 5, further comprising a graphite thermal interface material disposed between the cooling plate structure and the chuck.

7. The system of claim 6, wherein the thermal interface material comprises graphite.

8. The system of claim 1, further comprising at least one valve for adjusting the flow of the cooling liquid to the cooling plate structure.

9. A substrate support assembly, comprising:
    a pedestal;
    a chuck connected to the pedestal;
    a cooling plate structure thermally coupled with the chuck;
    a heater thermally coupled with the cooling plate structure;
    a thermal interface material consisting of a single graphite material forming thermally conductive sheets disposed between the heater and the cooling plate structure, wherein the thermal interface material has a plurality of holes formed therethrough in a pattern that limits loss of heating power to the cooling plate structure; and
    a controller configured to control the cooling plate structure while controlling the heater using a proportional-integral-derivative (PID) subcontroller thermally coupled to the heater.

10. The substrate support assembly of claim 9, wherein the cooling plate structure has conduits for cooling fluid flow.

11. The substrate support assembly of claim 9, wherein the heater is disposed above the cooling plate structure.

12. The substrate support assembly of claim 11, further comprising a thermal interface material disposed between the heater and the chuck.

13. The substrate support assembly of claim 9, wherein the heater is disposed below the cooling plate structure.

14. The substrate support assembly of claim 13, further comprising a thermal interface material disposed between the cooling plate structure and the chuck.

15. A substrate support assembly, comprising:
    a pedestal;
    a chuck connected to the pedestal;
    a cooling plate structure thermally coupled with the chuck;
    a heater thermally coupled with the cooling plate structure; and
    a thermal interface material consisting of a single graphite material forming thermally conductive sheets disposed between the heater and the cooling plate structure, wherein the thermal interface material has a plurality of holes formed therethrough in a pattern that limits loss of heating power to the cooling plate structure.

16. The substrate support assembly of claim 15, wherein the thermal interface material has a thickness of between about 1 micron and about 5 microns.

17. The substrate support assembly of claim 15, further comprising a controller configured to control the cooling plate structure while controlling the heater using a proportional-integral-derivative (PID) subcontroller thermally coupled to the heater.

* * * * *